United States Patent
Park et al.

(10) Patent No.: US 7,534,709 B2
(45) Date of Patent: May 19, 2009

(54) SEMICONDUCTOR DEVICE AND METHOD OF MANUFACTURING THE SAME

(75) Inventors: Jae-Hwa Park, Gyeonggi-do (KR); Gil-Heyun Choi, Gyeonggi-do (KR); Chang-Won Lee, Gyeonggi-do (KR); Byung-Hak Lee, Suwon-si (KR); Hee-Sook Park, Seoul (KR); Woong-Hee Sohn, Gyeonggi-do (KR); Jong-Ryeol Yoo, Gyeonggi-do (KR); Sun-Pil Yun, Seoul (KR); Jang-Hee Lee, Seoul (KR); Dong-Chan Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 400 days.

(21) Appl. No.: 11/233,580

(22) Filed: Sep. 23, 2005

(65) Prior Publication Data

US 2006/0014355 A1    Jan. 19, 2006

Related U.S. Application Data

(63) Continuation-in-part of application No. 10/448,534, filed on May 29, 2003, now abandoned.

(30) Foreign Application Priority Data

Dec. 8, 2004    (KR) .................. 10-2004-0102916

(51) Int. Cl.
    *H01L 21/3205*    (2006.01)
(52) U.S. Cl. ............... 438/592; 438/591; 257/E21.439; 257/E21.622; 257/E21.636

(58) Field of Classification Search .................. 438/591, 438/592, 652, 653, 655, 663, 664
See application file for complete search history.

(56) References Cited

U.S. PATENT DOCUMENTS 4,540,607 A * 9/1985 Tsao .......................... 427/253

(Continued)

FOREIGN PATENT DOCUMENTS

JP    11-289087    10/1999

(Continued)

OTHER PUBLICATIONS

English language abstract of Korean Publication No. 2000-0009254.

(Continued)

*Primary Examiner*—Quoc D Hoang
(74) *Attorney, Agent, or Firm*—Marger Johnson & McCollom, P.C.

(57) ABSTRACT

Embodiments of the present invention include semiconductor devices that can be made with relatively low resistance, and methods of forming the semiconductor devices. A resistance reducing layer is formed between a polysilicon layer and a metal layer. As a result, an interface resistance between the polysilicon layer and the metal layer is greatly reduced and a distribution of the interface resistance is very uniform. As a result, a conductive structure including the resistance reducing layer has a greatly reduced sheet resistance to improve electrical characteristics of a semiconductor device having the conductive structure.

10 Claims, 12 Drawing Sheets

U.S. PATENT DOCUMENTS

| | | | |
|---|---|---|---|
| 5,837,592 A * | 11/1998 | Chang et al. | 438/382 |
| 5,891,785 A | 4/1999 | Chang | |
| 6,133,149 A | 10/2000 | Yeh | |
| 6,207,524 B1 | 3/2001 | Gutsche | |
| 6,277,719 B1 | 8/2001 | Chen et al. | |
| 6,340,629 B1 | 1/2002 | Yeo et al. | |
| 6,534,375 B2 * | 3/2003 | Iijima et al. | 438/386 |
| 6,800,543 B2 * | 10/2004 | Taguwa | 438/592 |
| 2001/0020715 A1 | 9/2001 | Yamasaki et al. | |
| 2002/0074614 A1 | 6/2002 | Furuta et al. | |
| 2003/0123216 A1 | 7/2003 | Yoon et al. | |
| 2003/0170942 A1 | 9/2003 | Taguwa | |
| 2003/0190424 A1 | 10/2003 | Sneh | |

FOREIGN PATENT DOCUMENTS

| | | |
|---|---|---|
| JP | 2002-26316 | 1/2002 |
| JP | 2003-163348 | 6/2003 |
| KR | 2000-0009254 | 2/2000 |
| KR | 2001-0003473 | 1/2001 |
| KR | 2001-0083569 | 9/2001 |
| KR | 2001-98593 | 11/2001 |
| KR | 2002-0002630 | 1/2002 |
| KR | 2002-0008771 | 1/2002 |
| KR | 2002-0038273 | 5/2002 |
| KR | 2004-0001861 | 1/2004 |

OTHER PUBLICATIONS

English language abstract of Korean Publication No. 2001-0083569.
English language abstract of Korean Publication No. 2001-0003473.
English language abstract of Korean Publication No. 2002-0002630.
English language abstract of Korean Publication No. 2002-0038273.
English language abstract of Japanese Publication No. 11-289087.
English language abstract of Japanese Publication No. 2002-26316.
English language abstract of Japanese Publication No. 2003-163348.
Research Disclosure RD 305016 A published by Derwent on Sep. 10, 1989 (no images available).
S. Wolf and R.N. Tauber, "Silicon Processing for the VLSI Era", vol. 1—Process Technology, second edition (2000), Lattice Press, Sunset Beach, California 90742, USA (pp. 207-208).
English language abstract of Korean Publication No. 2001-98593.

* cited by examiner

SEMICONDUCTOR DEVICE AND METHOD OF MANUFACTURING THE SAME

CROSS REFERENCE TO RELATED APPLICATION

This application is a continuation-in-part of U.S. patent application Ser. No. 10/448,534, filed on May 29, 2003 now abandoned and entitled "Semiconductor Structure having low resistance and Method of Manufacturing the same", the contents of which are incorporated herein by reference. This application also claims priority from Korean Patent Application No. 2004-0102916, filed on Dec. 8, 2004, the contents of which are herein incorporated by reference in their entirety.

BACKGROUND

1. Field of the Invention

The present invention relates to a semiconductor device and a method of manufacturing the semiconductor device. More particularly, the present invention relates to a semiconductor device including a resistance reducing layer to reduce a resistance thereof, and a method of manufacturing the semiconductor device.

2. Description of the Related Art

Integrated semiconductor devices continue to have increased packing density, higher operating frequencies, and lower operating voltages. As these trends continue, the feature size of patterns formed on a chip and the space between the formed patterns becomes smaller. Polysilicon has been a very useful material for forming and interconnecting individual components, such as for forming gate electrodes. However, as the pattern size decreases, resistances of interconnections become increasingly important. Because polysilicon has a relatively high resistivity, and pattern sizes continue to decrease, polysilicon interconnections have a relatively higher RC (resistive-capacitive) time delay and IR (current-resistance) voltage drop than earlier circuits having larger pattern sizes.

Therefore, polycide structures, which have similar characteristics to those of polysilicon, while having a lower resistivity than that of polysilicon, have become increasingly popular. One method of using a polycide structure is to have a multilayer structure consisting of a refractory metal silicide, such as titanium silicide or tungsten silicide on a doped polysilicon layer. Such a structure has been used to interconnect and form components, such as gate electrodes of very large scale integrated (VLSI) circuits. However, the resistivity of the tungsten silicide is approximately 100 $\mu\Omega$-cm, which is still relatively high, and further reduction in the resistivity of the gate electrode is required to form acceptable sub-quarter-micron ultra-large scale integrated (ULSI) circuits.

Thus, the industry has recently turned to tungsten-polysilicon (hereinafter, referred to as "W-poly") gate structures, because a W-poly gate structure has a resistivity of approximately 10 $\mu\Omega$-cm, which is lower than that of the conventional polysilicon or polycide gate electrodes.

FIG. 1 is a cross sectional view of a conventional MOS transistor having a W-poly gate structure.

Referring to FIG. 1, a gate dielectric layer 15 is formed on a silicon substrate 10. A gate stack 35, which includes a doped polysilicon layer 20, a barrier layer 25 and a tungsten (W) layer 30, is formed on the gate dielectric layer 15. A gate capping layer 40 of silicon nitride (SiN) is formed on the gate stack 35. Because tungsten reacts with silicon (Si) at a temperature as low as 600° C. in a process known as silicidation, it is necessary to form a high quality diffusion barrier layer 25 between the W layer 18 and the polysilicon layer 20 to prevent such silicidation. Titanium nitride (TiN) and tungsten nitride (WN) and are both candidates for the barrier 25 to avoid silicidation of the W layer 30.

In a conventional post-gate etching process, dry or wet oxidation (i.e., selective oxidation) is used to cure the etch damage and to improve the gate dielectric strength. Thus, all gate materials, including the metal materials (W and the barrier material) are subjected to this oxidation. Under selective oxidation conditions, the W-based materials will not be oxidized. However, if the barrier layer 25 includes TiN, the TiN layer can oxidize, thereby resulting in lift-off of the W layer 30. Accordingly, the W-poly gate electrode without TiN is preferred, from a point of a low resistivity and process integration.

There are also problems with using WN as the barrier layer 25. When the barrier layer 25 is formed of WN, nitrogen ($N_2$) flows into the polysilicon layer 20 during the deposition of the WN barrier layer 25. This causes nitrogen to react with the polysilicon layer 20 to form a high resistance SiN-based insulation layer between the WN barrier layer 25 and the polysilicon layer 20. Further, during the selective oxidation process, oxidants diffuse into the interface between the WN barrier layer 25 and the polysilicon layer 20 to thereby form an insulating layer, such as a silicon oxynitride layer. This causes even more resistance, which in turn increases the contact resistance (Rc) between the W layer 30 and the polysilicon layer 20.

As mentioned above, increased resistance is to be avoided, because increased resistance causes a higher RC delay, which in turn causes a time delay tRCD (Ras to CAS time delay) failure in memory devices, thereby deteriorating the yield and the operating speed of the end component.

A tungsten silicide layer is formed on a polysilicon layer by a chemical vapor deposition (CVD) process or a physical vapor deposition (PVD) process to reduce an interface resistance between the polysilicon layer and a metal layer formed on the polysilicon layer.

When the tungsten silicide layer is interposed between the polysilicon layer and the metal layer using the CVD process, the uniformity of the tungsten silicide layer is poor causing the interface resistance between the polysilicon layer and the metal layer to be irregular. In addition, since the tungsten silicide layer is mainly formed using a dichlorosilane ($SiH_2Cl_2$) gas or a tungsten hexafluoride ($WF_6$) gas as a source gas, halogen elements contained in the source gas serve as impurities so that the interface resistance between the polysilicon layer and the metal layer increases.

When the tungsten silicide layer is formed between the polysilicon layer and the metal layer using the PVD process, ingredients in the tungsten silicide layer agglomerate in a successive high temperature process because the tungsten silicide layer having an amorphous phase is formed on the polysilicon layer. Thus, the distribution of the interface resistance between the polysilicon layer and the metal layer becomes irregular and a conductive structure including the agglomerated tungsten silicide layer has an increased sheet resistance.

SUMMARY OF THE INVENTION

The present invention provides a semiconductor device having a resistance reducing layer without an agglomeration of ingredients.

The present invention also provides a method of manufacturing a semiconductor device having a low resistance by forming a resistance reducing layer without an agglomeration of ingredients.

In accordance with one embodiment of the present invention, a semiconductor device includes an insulation layer formed on a semiconductor substrate, a polysilicon layer formed on the insulation layer, a barrier layer formed on the polysilicon layer, a metal layer formed on the barrier layer, and a resistance reducing layer formed between the polysilicon layer and the barrier layer to reduce a resistance between the polysilicon layer and the metal layer.

In accordance with another embodiment of the present invention, there is provided a method of manufacturing a semiconductor device. In the method of manufacturing the semiconductor device, after an insulation layer is formed on a semiconductor substrate, a polysilicon layer is formed on the insulation layer. A resistance reducing layer is formed on the polysilicon layer using metal silicide formed by a physical vapor deposition process. After a barrier layer is formed on the resistance reducing layer, a metal layer is formed on the barrier layer.

BRIEF DESCRIPTION OF THE DRAWINGS

The invention will be understood more fully from the detailed description given below and from the accompanying drawings of embodiments of the invention, which, however, should not be taken to limit the invention to the specific embodiments, but are to facilitate explanation and understanding.

DETAILED DESCRIPTION OF THE INVENTION

Figure 1:
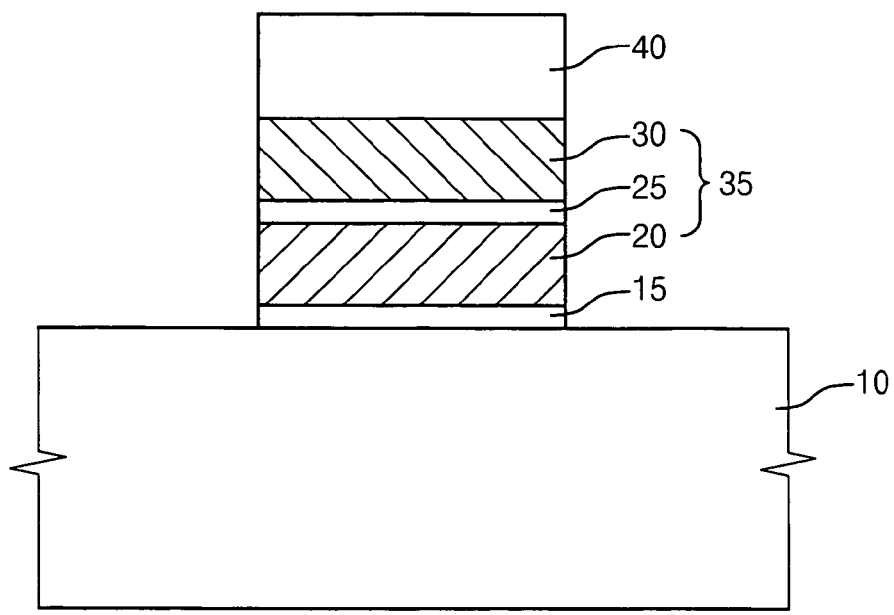
FIG. 1 is a cross-sectional view illustrating a conventional MOS transistor having a W-poly gate structure.

In the following detailed descriptions, numerous specific details are set forth to provide a thorough understanding of the invention. However, it will be understood by those skilled in the art that the present invention may be practiced without these specific details. In other instances, well-known methods, procedures, components and processes have not been described in detail so as not to obscure the explanation of the present invention.

Embodiments of the invention are directed toward a MOS transistor having a gate stack with low resistance, and methods of forming such a transistor. This low resistance is obtained by preventing the formation of highly resistive materials that typically occur when creating the gate stack using conventional methods.

In one embodiment of the present invention, a conductive structure includes a polysilicon layer pattern, a resistance reducing layer pattern formed on the polysilicon layer pattern, and a metal layer pattern formed on the resistance reducing layer pattern. The resistance reducing layer pattern may include a metal silicon nitride film such as a tungsten silicon nitride (WSiN) film or an aluminum silicon nitride (AlSiN) film. The metal layer pattern may include tungsten (W) or aluminum (Al). Here, the conductive structure may include a gate structure, a contact structure, a pad structure, a word line, a bit line, or other wirings in a semiconductor device.

In another embodiment of the present invention, a conductive structure additionally includes a barrier layer pattern formed between the resistance reducing layer pattern and the metal layer pattern. The barrier layer pattern may include a metal nitride such as tungsten nitride (WN) or titanium nitride (TiN).

In still another embodiment of the present invention, a conductive structure further includes a capping layer pattern formed on the metal layer pattern. The capping layer pattern may include a nitride such as silicon nitride.

In still another embodiment of the present invention, a conductive structure includes a polysilicon layer pattern of which surface is treated with an ammonia plasma or a nitrogen plasma. A metal layer pattern is formed on the polysilicon layer pattern. Here, a resistance reducing layer pattern and/or a barrier layer pattern may be formed between the polysilicon layer pattern and the metal layer pattern.

In a method of manufacturing a semiconductor device according to one embodiment of the present invention, a polysilicon layer pattern is formed on a semiconductor substrate. A metal silicide film pattern is formed on the polysilicon layer pattern by a physical vapor deposition (PVD) process. The metal silicide layer film pattern may have a thickness of about 30 to about 100 Å and include tungsten silicide ($WSi_x$) or aluminum silicide ($Al_xSi_y$). In the PVD process, the metal silicide film pattern is formed using an argon (Ar) plasma or a nitrogen plasma. Then, the metal silicide film pattern is treated using an ammonia plasma or a nitrogen plasma with a power of about 50 to about 60 W for about 10 to about 30 seconds so that the metal silicide film pattern is changed into a metal silicon nitride film pattern. As a result, a resistance reducing layer pattern including the metal silicon nitride film pattern is formed on the polysilicon layer pattern. The metal silicon nitride film pattern may include tungsten silicon nitride or aluminum silicon nitride. A metal layer pattern is formed on the resistance reducing layer pattern to thereby form a conductive structure of the semiconductor device on the semiconductor substrate. The metal layer pattern may include tungsten or aluminum. As described above, a barrier layer pattern may be formed between the resistance reducing layer pattern and the metal layer pattern. The barrier layer pattern may include metal nitride. Further, a capping layer pattern including nitride may be formed on the metal layer pattern.

In a method of manufacturing a semiconductor device according to another embodiment of the present invention, after a polysilicon layer pattern is formed on a semiconductor substrate, a metal silicide film pattern having a thickness of about 30 to about 100 Å is formed on the polysilicon layer pattern. The metal silicide film pattern is changed into a metal silicon nitride film pattern by a rapid thermal process (RTP) under a nitrogen atmosphere. Thus, a resistance reducing layer pattern including the metal silicon nitride film pattern is formed on the polysilicon layer pattern. Here, the metal silicide film pattern may be thermally treated at a temperature of about 500 to about 1,000° C. for about 10 to about 30 seconds. A metal layer pattern is formed on the resistance reducing layer pattern to form a conductive structure of the semiconductor device. A barrier layer pattern may be formed between the resistance reducing layer pattern and the metal layer pattern, and also a capping layer pattern may be formed on the metal layer pattern.

In a method of manufacturing a semiconductor device according to still another embodiment of the present invention, a polysilicon layer pattern is formed on a semiconductor substrate. A surface of the polysilicon layer pattern is treated using an ammonia plasma or a nitrogen plasma with a power of about 50 to about 600 W. A metal silicide film pattern is formed on the polysilicon layer pattern having the treated surface by a PVD process so that a resistance reducing layer pattern including the metal silicide film pattern is formed on the polysilicon layer pattern. Here, the metal silicide film pattern may be treated using an ammonia plasma or a nitrogen plasma such that the metal silicide film pattern is changed into a metal silicon nitride film pattern as described above. A metal layer pattern is formed on the resistance reducing layer pattern to thereby form a conductive structure of the semiconductor device on the semiconductor substrate.

Figure 7:
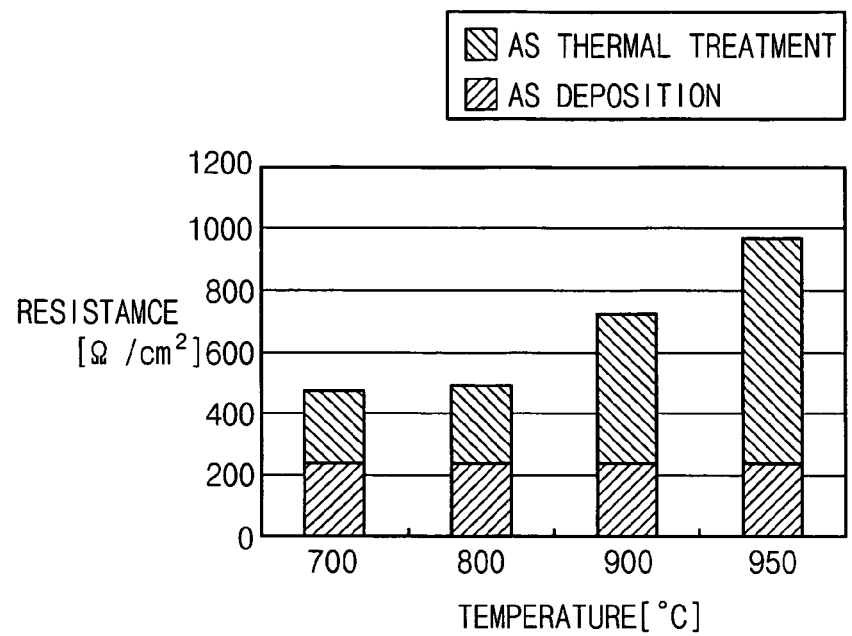
FIG. 7 is a graph illustrates sheet resistances of conductive structures including the tungsten silicide films in FIGS. 6A to 6D.

FIGS. 6A to 6D are electron microscope photographs illustrating tungsten silicide films formed by a PVD process relative to temperature. The tungsten silicide films formed on polysilicon layers by the PVD process are thermally treated at temperatures of about 700° C., 800° C., 900° C., and 950° C., respectively. FIG. 7 is a graph illustrating sheet resistances of conductive structures including the tungsten silicide films in FIGS. 6A to 6D.

When the tungsten silicide films formed by the PVD process are thermally treated at the temperature of about 700 to about 950° C., ingredients included in the tungsten silicide films agglomerate as the temperature increases. Additionally, the sheet resistances of the conductive structures are augmented in accordance with an increase of the temperature. When the ingredients in the tungsten silicide films agglomerate, the conductive structures have increased sheet resistances because the tungsten silicide films have an irregular thickness (that is, some portions of the tungsten silicide films are substantially thicker than other portions of the tungsten silicide films). Further, when the tungsten silicide film has an irregular thickness, the barrier layer formed on the tungsten silicide film may be broken. Hence, the metal layer may not be formed on the broken barrier layer because the polysilicon layer is exposed if the barrier layer is broken. When the metal layer is directly formed on the exposed polysilicon layer, metal in the metal layer reacts with silicon in the polysilicon layer to thereby deteriorate the conductive structure.

According to the present invention, the resistance reducing layer including the metal silicon nitride film or the metal silicide film is formed on the polysilicon layer after treating the metal silicide film and/or the polysilicon layer using the ammonia or nitrogen plasma, thereby effectively preventing the ingredients in the resistance reducing layer from agglomerating. Therefore, an interface resistance between the polysilicon layer and the metal layer is considerably reduced and the sheet resistance of the conductive structure having the resistance reducing layer is greatly reduced. Further, the distribution of the sheet resistance of the conductive structure becomes more uniform. Moreover, the conductive structure has an improved uniformity because the barrier layer and the metal layer are formed on the resistance reducing layer without the agglomeration of the ingredients in the resistance reducing layer.

Hereinafter, a semiconductor and a method of manufacturing the semiconductor device will be described in detail with reference to accompanying drawings.

Figure 2:
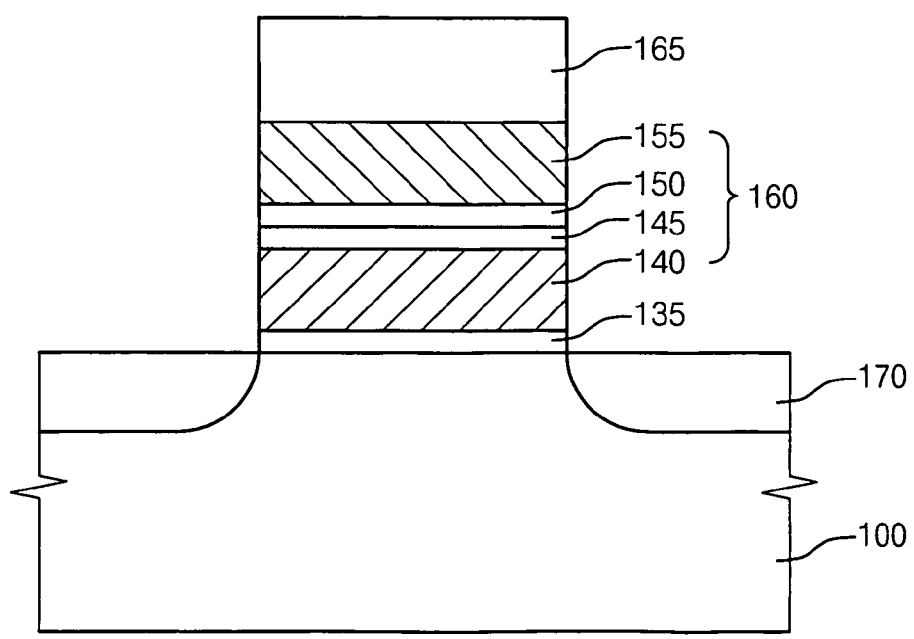
FIG. 2 is a cross-sectional view of a MOS transistor having a gate structure according to an embodiment of the present invention.

FIG. 2 is a cross-sectional view of a MOS transistor having a gate structure in accordance with an embodiment of the present invention.

Referring to FIG. 2, the MOS transistor is formed in an active region of a semiconductor substrate 100 defined by a field isolation layer (not shown). The MOS transistor has active source/drain regions 170 and the gate structure. The gate structure includes a gate insulation layer pattern 135, a gate electrode 160, and a gate capping layer pattern 165.

The insulation layer pattern 135 is formed in the active region of the substrate 100. The gate electrode 160 is positioned on the gate insulation layer pattern 135. The gate electrode 160 further includes a polysilicon layer pattern 140, a resistance reducing layer pattern 145, a barrier layer pattern 150 and a metal layer pattern 155.

The gate capping layer pattern 165, including a nitride such as silicon nitride, is formed on the gate electrode 160. The gate capping layer pattern 165 prevents the gate electrode 160 from being oxidized in a subsequent annealing process at a relatively high temperature. In addition, the gate capping layer pattern 165 serves as an etching mask in an etching process for forming the gate structure.

The polysilicon layer pattern 140 may be doped with impurities to improve its electrical conductivity.

The barrier layer pattern 150 may include a metal nitride such as tungsten nitride or aluminum nitride. The barrier layer pattern 150 prevents a reaction, which may increase a sheet resistance of the gate structure, between the polysilicon layer pattern 140 and the metal layer pattern 155. The barrier layer pattern 150 is formed between the polysilicon layer pattern 140 and the metal layer pattern 155. The barrier layer pattern 150 may include a metal substantially identical to that of the metal layer pattern 155. For example, the barrier layer pattern 150 and the metal layer pattern 155 may include tungsten or aluminum.

The resistance reducing layer pattern 145 is formed between the polysilicon layer pattern 140 and the barrier layer pattern 150. The resistance reducing layer pattern 145 prevents an insulation film having a high resistance, such as a silicon nitride film, from being formed on the polysilicon layer pattern 140 during formation of the barrier layer pattern 150. Thus, the resistance reducing layer pattern 145 may include a metal silicon nitride such as tungsten silicon nitride that is changed from tungsten silicide. As described above, because ingredients contained in the resistance reducing layer pattern 145 do not agglomerate during subsequent high temperature processes, the resistance reducing layer pattern 145 prevents the barrier layer pattern 150 from damaging the polysilicon layer pattern 140, thereby preventing damage to the gate structure. Additionally, the resistance reducing layer pattern 145 sufficiently reduces the sheet resistance of the gate structure. Furthermore, the resistance reducing layer pattern 145 prevents an oxidant from diffusing into an interface between the barrier layer pattern 150 and the polysilicon layer pattern 140 in a subsequent selective oxidation process for curing etched damage caused by etching of the gate insulation layer pattern 135 and the semiconductor substrate 100.

As a result, the resistance reducing layer pattern 145 prevents formation of a silicon oxynitride film that is caused by a reaction among nitrogen in the barrier layer pattern 150, silicon in the polysilicon layer pattern 140, and the diffused oxidant.

A method for forming the MOS transistor will now be described with reference to FIGS. 3A to 3D. FIGS. 3A to 3D are cross-sectional views illustrating a method of manufacturing the MOS transistor in FIG. 2.

Figure 3A:
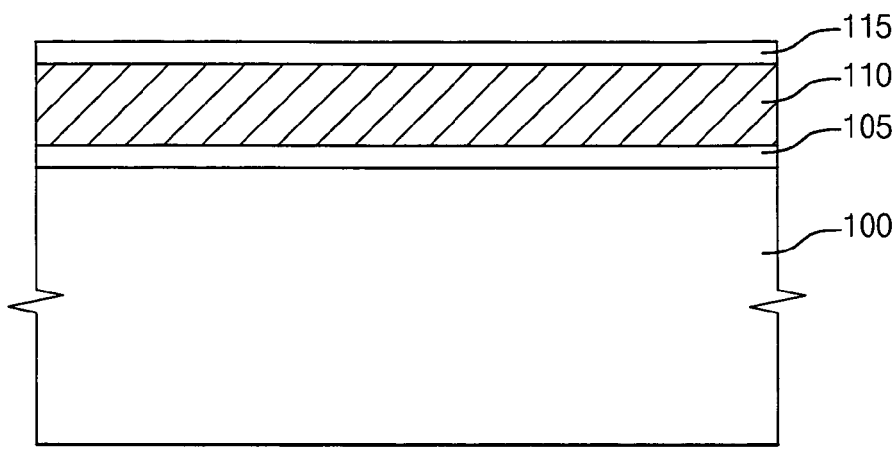
FIGS. 3A, 3B, 3C and 3D are cross-sectional views illustrating a method of manufacturing the MOS transistor in FIG. 2.

Referring to FIG. 3A, a gate insulation layer 105 is formed on the semiconductor substrate 100. The gate insulation layer 105 may have a thickness of about 50 to about 60 Å. The gate insulation layer 105 may be formed using a thermal oxidation process or a chemical vapor deposition (CVD) process. The gate insulation layer 105 may include silicon oxide or silicon oxynitride.

A polysilicon layer 110 doped with impurities is formed on the gate insulation layer 105. The polysilicon layer 110 may be formed by a CVD process to have a thickness of about 100 to about 2,000 Å.

A resistance reducing layer 115 is formed on the polysilicon layer 110. In particular, a metal silicide film is formed on the polysilicon layer 110 by a physical vapor deposition (PVD) process. The metal silicide film may include tungsten silicide and have a thickness of about 30 to about 100 Å. Additionally, the metal silicide film may be formed on the polysilicon layer 110 using an argon (Ar) plasma or a nitrogen ($N_2$) plasma. Thus, the metal silicide film is changed into a metal silicon nitride film by treating the metal silicide film with an ammonia ($NH_3$) plasma or a nitrogen ($N_2$) plasma. The metal silicon nitride film may be formed at a temperature of about 500 to about 1,000° C. with a power of about 50 to about 600 W for about 10 to about 30 seconds. Accordingly, the resistance reducing layer 115 composed of the metal silicon nitride film is formed on the polysilicon layer 110.

In another embodiment of the present invention, the metal silicide film formed on the polysilicon layer 110 is treated using a rapid thermal process (RTP) under an ammonia atmosphere or a nitrogen atmosphere, thereby changing the metal silicide film into the metal silicon nitride film. Here, the RTP is carried out at a temperature of about 500 to about 1,000° C. for about 10 to about 30 seconds.

In still another embodiment of the present invention, after a surface of the polysilicon layer 110 is directly treated using an ammonia plasma or a nitrogen plasma, the resistance reducing layer 115 composed of a metal silicide film is formed on the polysilicon layer 110. Thus, agglomeration of the ingredients in the resistance reducing layer 115 is effectively prevented. Here, processing conditions for treating the surface of the polysilicon layer 110 are substantially identical to those described-above.

Figure 8A:
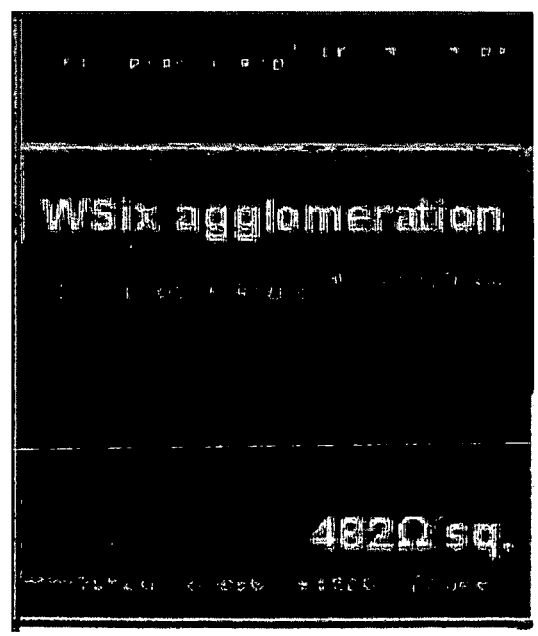
FIGS. 8A to 8E are electron microscopic photographs illustrating metal silicide films and metal silicon nitride films formed on polysilicon layers, respectively.
Figure 8B:
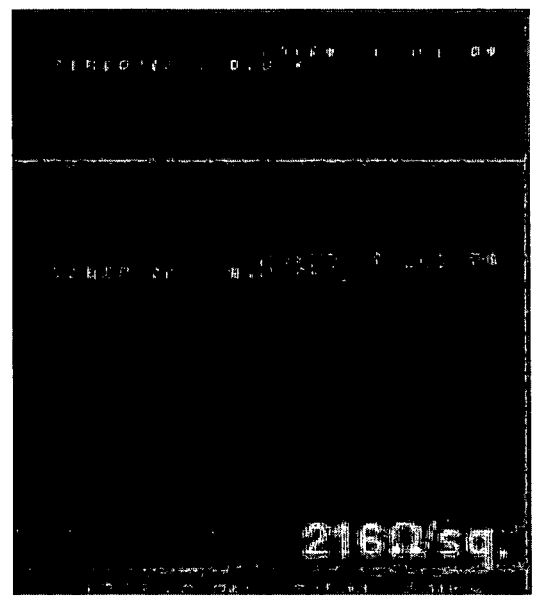
Figure 8C:
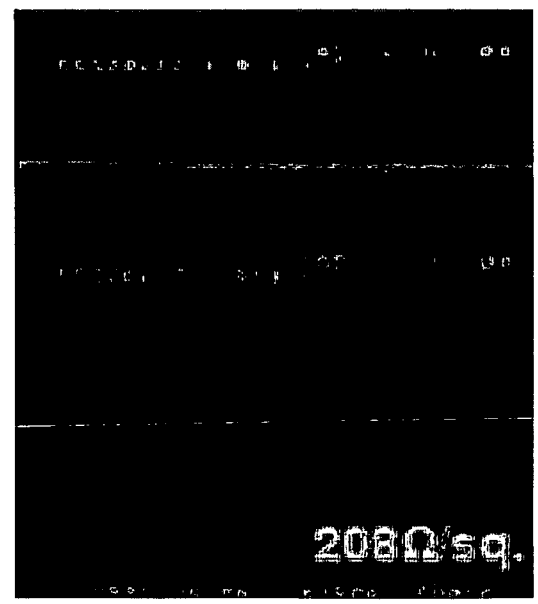
Figure 8D:
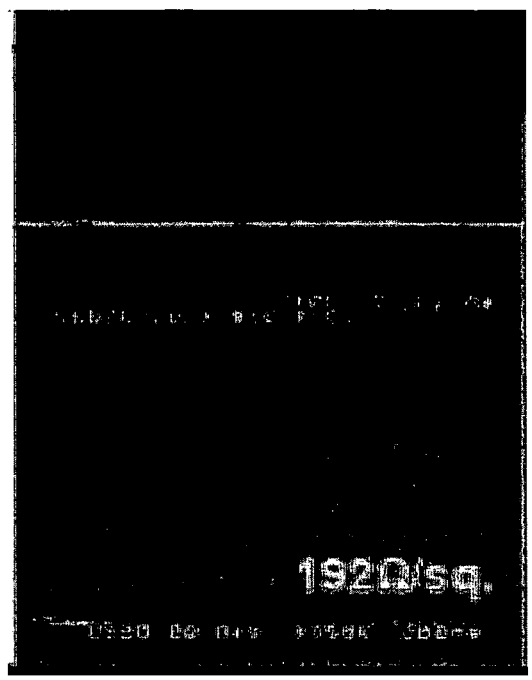
Figure 8E:
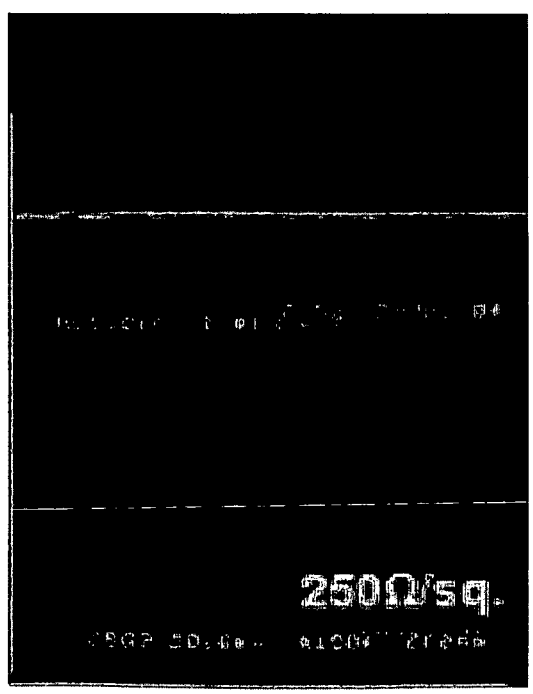

FIGS. 8A to 8E are electron microscope photographs illustrating metal silicide films and metal silicon nitride films formed on polysilicon layers, respectively. FIG. 8A shows a metal silicide film formed on a polysilicon layer without treating with an ammonia plasma or a nitrogen plasma. FIGS. 8B and 8C illustrate metal silicide films formed on polysilicon layers after treating with an ammonia plasma and a nitrogen plasma, respectively. FIGS. 8D and 8E show metal silicon nitride films formed on polysilicon layers after changing metal silicide films into the metal silicon nitride films using an ammonia plasma and a nitrogen plasma, respectively.

As shown in FIG. 8A, when the metal silicide film is formed on the polysilicon layer without treating the ammonia or nitrogen plasma, ingredients in the metal silicide film agglomerate in a successive thermal process. Since the ingredients in the metal silicide film agglomerate, a gate structure that includes the metal silicide film has a relatively high sheet resistance of about 482 $\Omega/cm^2$.

Referring to FIGS. 8B and 8C, when the metal silicide films formed on the polysilicon layers after surfaces of the polysilicon layers are respectively treated using the ammonia plasma and the nitrogen plasma at a temperature of about 650° C. with a power of about 300 W, agglomerations of ingredients in the metal silicide films are reduced so that gate structures, including these metal silicide films, have greatly reduced sheet resistances of about 216 $\Omega/cm^2$ and 208 $\Omega/cm^2$.

As shown in FIGS. 8D and 8E, the metal silicon nitride films change from the metal silicide films after the metal silicide films are formed on the polysilicon layers, after the metal silicide films are respectively treated. This treatment uses the ammonia plasma and the nitrogen plasma at the temperature of about 650° C. and with a power of about 300 W. Ingredients in the metal silicon nitride films are only slightly agglomerated so that gate structures including these metal silicon nitride films have extremely reduced sheet resistances of about 192 $\Omega/cm^2$ and about 250 $\Omega/cm^2$.

Figure 3B:
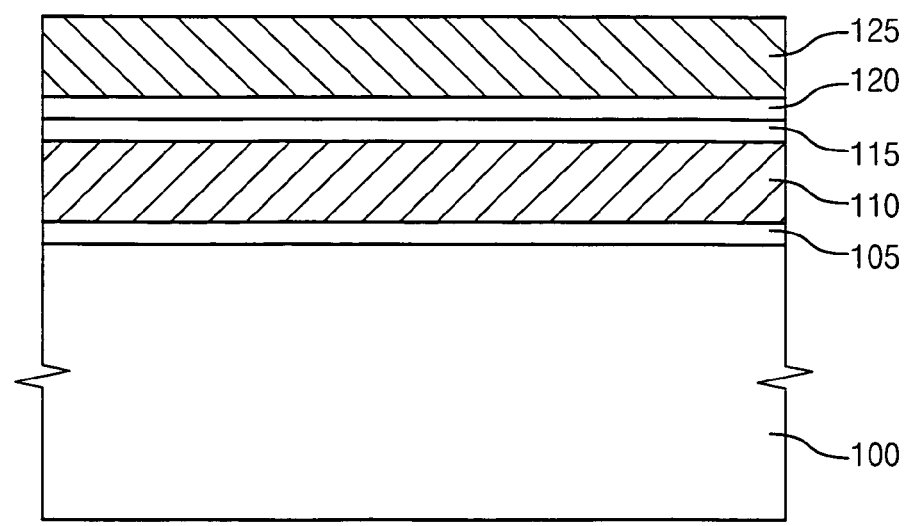

Referring to FIG. 3B, a barrier layer 120 is formed on the resistance reducing layer 115. The barrier layer 120 may have a thickness of about 10 to 100 Å. The barrier layer 120 may include a metal nitride such as tungsten nitride or titanium nitride. The barrier layer 120 may be formed on the resistance reducing layer 115 by a sputtering process, a CVD process, or an atomic layer deposition (ALD) process. The resistance reducing layer 115 reduces the resistance between the polysilicon layer 110 and a metal layer 125, and also prevents a silicon nitride film that is caused by a reaction between nitrogen in the barrier layer 120 and silicon in the polysilicon layer 110, from forming between the polysilicon layer 110 and the metal layer 125 in the formation of the barrier layer 120.

The metal layer 125 is formed on the barrier layer 120. The metal layer 125 may have a thickness of about 100 to about 1,000 Å and include a metal such as tungsten or aluminum. The metal layer 125 may be formed on the barrier layer 120 by a sputtering process, a CVD process, or an ALD process. For example, the metal layer 125 may be formed by the sputtering process using tungsten with a power of about 2 kW at a temperature of about 150° C. under a pressure of about 4 mTorr.

Figure 3C:
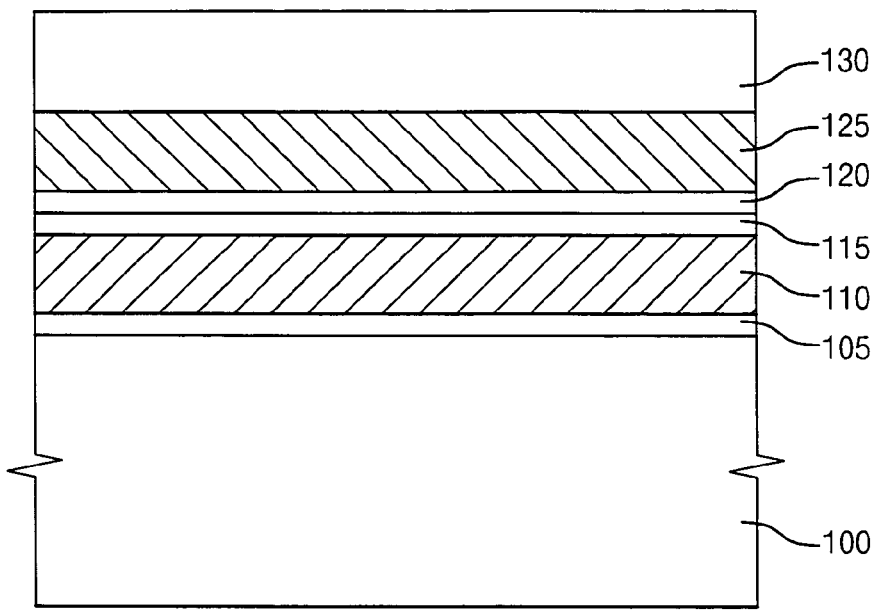

Referring to FIG. 3C, a capping layer 130 is formed on the metal layer 125. The capping layer 130 may be formed using a nitride such as silicon nitride by a CVD or an ALD process. The capping layer 130 may have a thickness to effectively prevent the metal layer 125 from oxidizing in a successive thermal process.

Figure 3D:
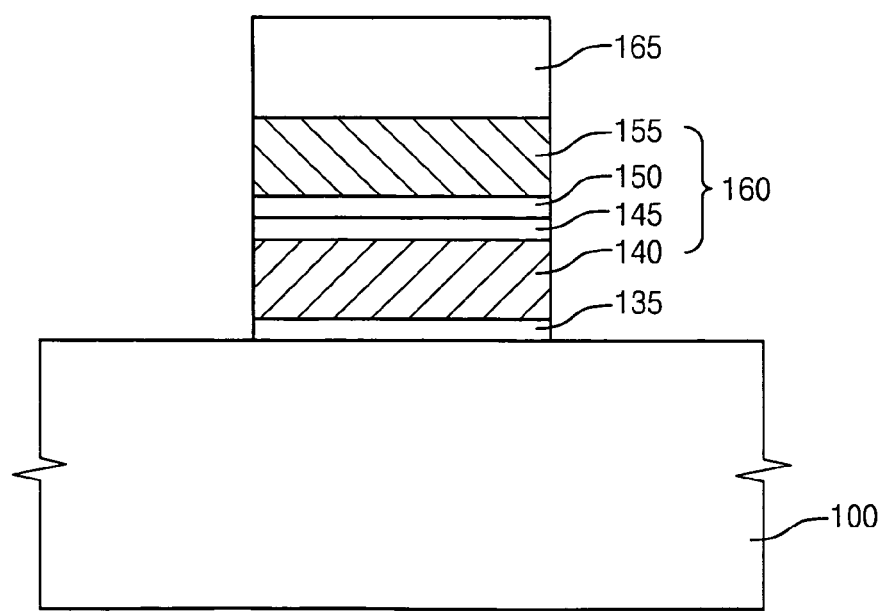

Referring to FIG. 3D, the capping layer 130 is partially etched by a photolithography process to form a capping layer pattern 165 on the metal layer 125.

Using the capping layer pattern 165 as an etching mask, the metal layer 125, the barrier layer 120, the resistance reducing layer 115, the polysilicon layer 110 and the gate insulation layer 105 are sequentially etched to form the gate insulation layer pattern 135 and the gate structure on the semiconductor substrate 100. The gate structure includes the gate electrode 160 and the capping layer pattern 165. The gate electrode 160 has the polysilicon layer pattern 140, the resistance reducing layer pattern 145, the barrier layer pattern 150, and the metal layer pattern 155.

A selective oxidation process may be performed at a temperature of about 600 to about 1,000° C. in ambient $H_2O/H_2$ to oxidize vertical edges of the polysilicon layer pattern 140 and the substrate 100. The selective oxidation process is used to cure etching damage to the substrate 100 and the gate insulation layer pattern 135, and to improve the gate-oxide integrity (GOI). During the selective oxidation process, the resistance reduction layer pattern 145, including the metal silicon nitride, prevents diffusion of oxidants towards an interface between the polysilicon layer pattern 140 and the barrier layer pattern 150, which would form an insulation film having a high resistance.

Source/drain regions 170 (see FIG. 2) are formed at portions of the active region of the substrate 100 by implanting impurities into the portions of the active region adjacent to the gate structure. Accordingly, the MOS transistor including the gate structure is formed on the substrate 100.

Figure 9A:
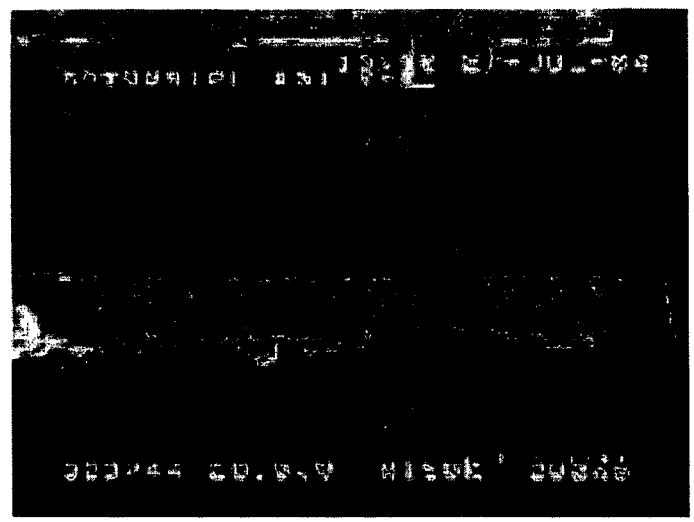
FIGS. 9A and 9B are electron microscopic photographs illustrating gate structures including a tungsten silicide film and a tungsten silicon nitride film, respectively.
Figure 9B:
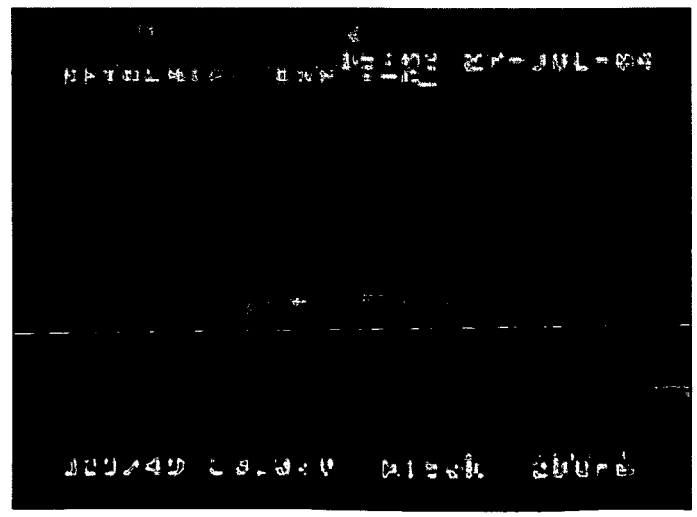

FIGS. 9A and 9B are electron microscope photographs illustrating gate structures including a tungsten silicide film and a tungsten silicon nitride film, respectively. FIG. 9A shows a gate structure having the tungsten silicide film not treating with an ammonia plasma or a nitrogen plasma. FIG. 9B illustrates a gate structure having the tungsten silicon nitride film treated with a nitrogen plasma.

Referring to FIG. 9A, the gate structure includes the tungsten silicide film, a barrier layer of tungsten nitride formed on the tungsten silicide film, and a metal layer of tungsten formed on the barrier layer. Here, the tungsten silicide film is not treated using the ammonia or nitrogen plasma. When the gate structure has this tungsten silicide film, ingredients in the tungsten silicide film agglomerate in successive thermal processes. As a result, the barrier layer is damaged so that the gate structure including this tungsten silicide film is deteriorated.

As shown in FIG. 9B, the gate structure includes the tungsten silicon nitride film, a barrier layer formed on the tungsten silicon nitride, and a metal layer formed on the barrier layer. Here, the tungsten silicon nitride is changed from a tungsten silicide film by treating the tungsten silicide with the nitrogen plasma. The gate structure, including the tungsten silicon nitride film, has a stable state with no damage because ingredients in the tungsten silicon nitride film do not agglomerate in successive thermal processes.

Figure 10:
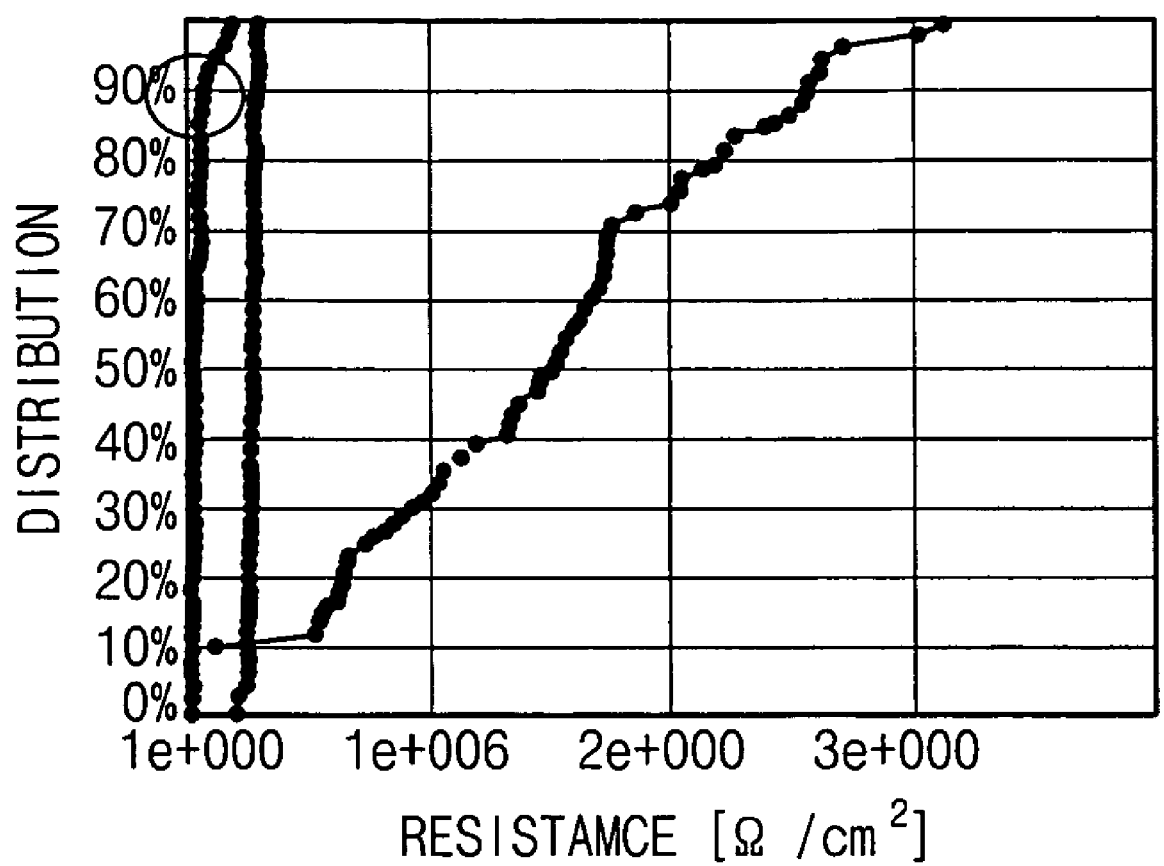
FIG. 10 is a graph illustrating cumulative distribution of an interface resistance between a polysilicon layer and a tungsten layer.

FIG. 10 is a graph illustrating interface resistance and the cumulative distribution of the interface resistance between a polysilicon layer and a tungsten layer. In FIG. 10, "I" indicates a cumulative distribution of a first interface resistance between a polysilicon layer and a tungsten layer by interposing a tungsten silicide film treated with an ammonia plasma or a nitrogen plasma. "II" represents a cumulative distribution of a second interface resistance between a polysilicon layer and a tungsten layer without interposing a tungsten silicide film treated with an ammonia plasma or a nitrogen plasma. "III" indicates a cumulative distribution of a third interface resistance between a polysilicon layer and a tungsten layer by interposing a tungsten silicide film without treating using an ammonia plasma or a nitrogen plasma. Each of the tungsten silicide films in FIG. 10 is formed by a PVD process.

If the tungsten silicide film is not treated with ammonia or nitrogen plasma, and is formed between the polysilicon layer and the tungsten layer, the third interface resistance III between the polysilicon layer and the tungsten layer is high and the distribution of the third interface resistance III is irregular. However, when the tungsten silicide film is treated using the ammonia or nitrogen, the first interface resistance I is reduced and the distribution of the first interface resistance I is uniform. Although the distribution of the second interface resistance II is somewhat uniform when the tungsten silicide film is not formed between the polysilicon layer and the tungsten layer, the second interface resistance II is about one hundred times larger than the interface resistance I.

Figure 4:
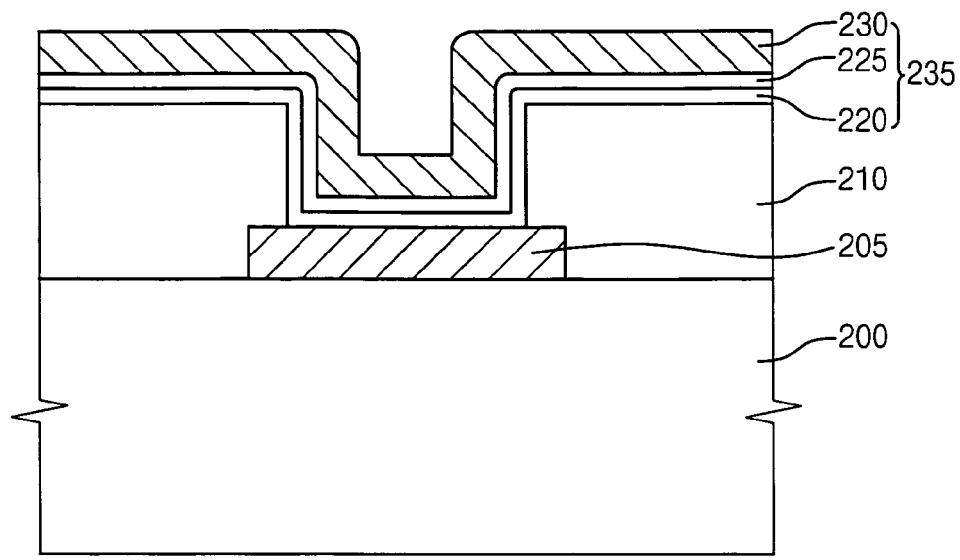
FIG. 4 is a cross-sectional view of a semiconductor device including a contact structure according to an embodiment of the present invention.
Figure 5A:
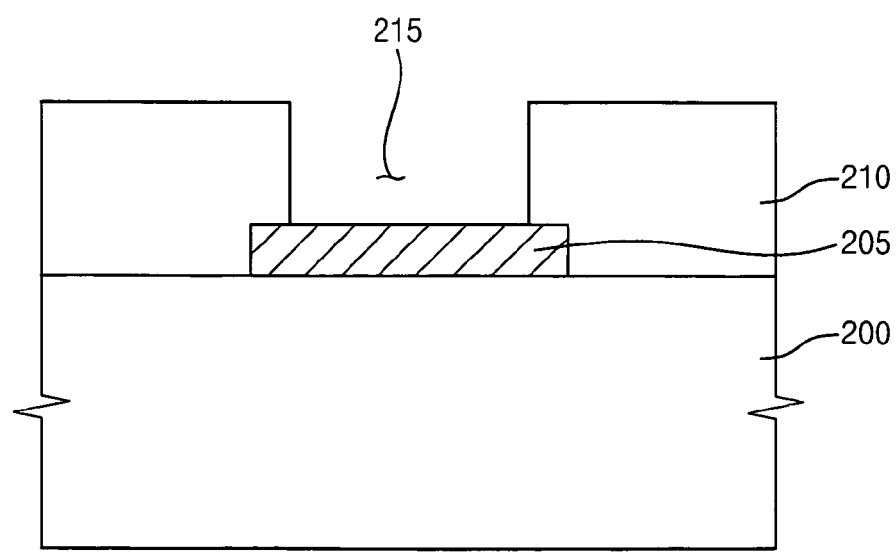
FIGS. 5A to 5C are cross-sectional views illustrating a method of manufacturing the semiconductor device in FIG. 4.
Figure 5B:
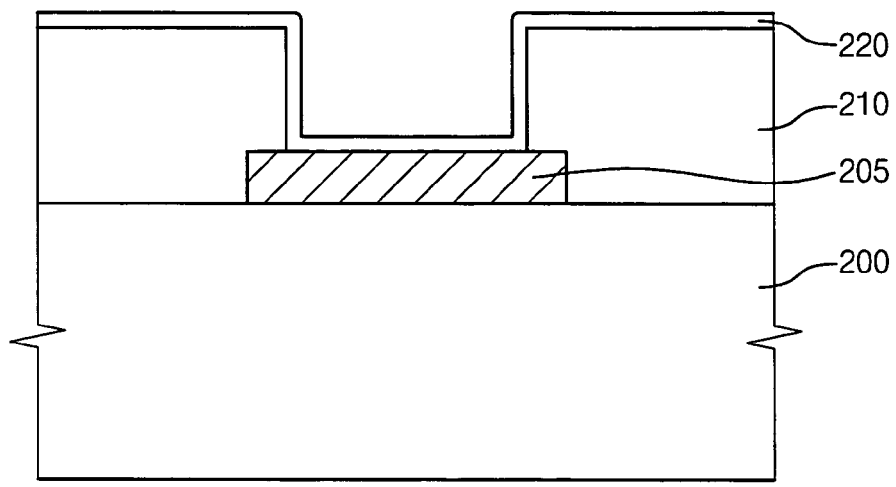
Figure 5C:
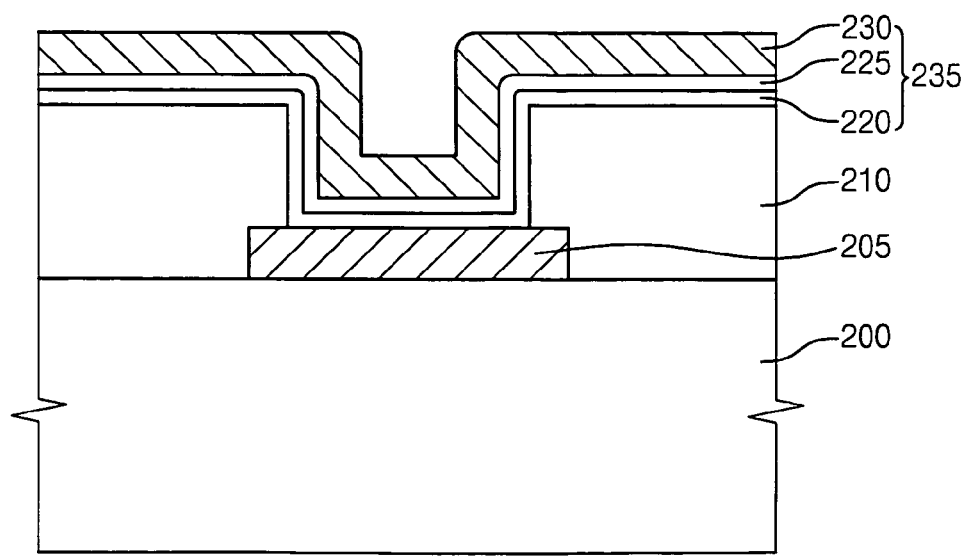
Figure 6A:
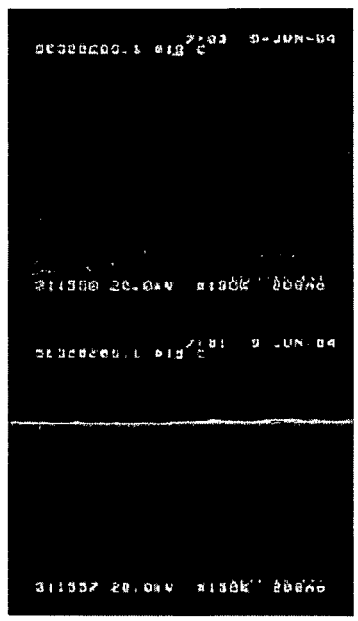
FIGS. 6A to 6D are electron microscopic photographs illustrating tungsten silicide films formed by a PVD process relative to a temperature.
Figure 6B:
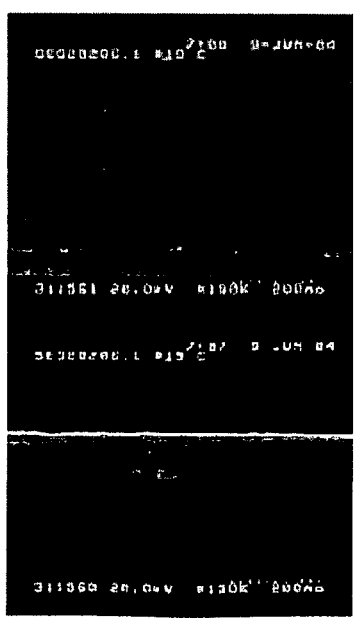
Figure 6C:
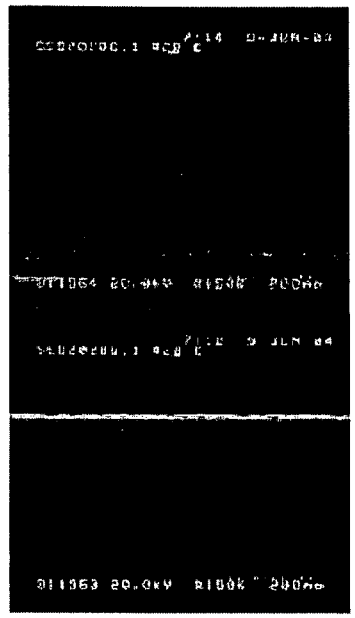
Figure 6D:
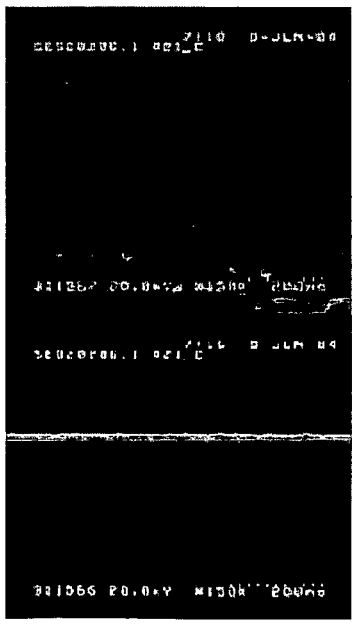

FIG. 4 is a cross-sectional view of a semiconductor device including a contact structure according to other embodiments of the present invention. FIGS. 5A to 5C are cross-sectional views illustrating a method of manufacturing the semiconductor device in FIG. 4.

Referring to FIGS. 4 and 5A, a polysilicon layer pattern 205 is formed on a semiconductor substrate 200. The polysilicon layer pattern 205 may serve as a pad, a plug, a contact, a wire, etc. The polysilicon layer pattern 205 may be formed on the substrate 200 by a CVD process to have a thickness of about 1,000 Å.

An insulating interlayer 210 is formed on the substrate 200 to cover the polysilicon layer pattern 205. The insulating interlayer 210 may be formed using an oxide by an HDP-CVD process. The insulating interlayer 210 is partially etched to form an opening 215 that exposes the polysilicon layer pattern 205.

Referring to FIGS. 4 and 5B, a resistance reducing layer 220 is formed on the exposed polysilicon layer pattern 205, an inside of the opening 215, and the insulating interlayer 210. The resistance reducing layer 220 may have a thickness of about 30 to about 100 Å. As described above, the resistance reducing layer 220 may include a metal silicon nitride film that is changed from a metal silicide film using an ammonia or nitrogen plasma.

When the resistance reducing layer 220 is formed using tungsten silicide, a tungsten film is formed on the exposed polysilicon layer pattern 205, the insulating interlayer 210, and the inside of the opening 215 by a sputtering process, a CVD process, or an ALD process. Then the tungsten film is changed into a tungsten silicide film by thermally treating the tungsten film in a nitrogen atmosphere. Alternatively, the tungsten silicide film is formed on the exposed polysilicon layer pattern 205, the insulating interlayer 210, and the inside of the opening 215 using a tungsten hexafluoride ($WF_6$) gas and a silane ($SiH_4$) gas by a CVD process or an ALD process. Here, the tungsten silicide film may be formed at a temperature of about 300 to about 400° C. under a pressure of about 200 mTorr.

A barrier layer 225 is formed on the resistance reducing layer 220. The barrier layer 225 may include a metal nitride such as tungsten nitride. The barrier layer 225 may be formed on the resistance reducing layer 220 by a sputtering process, a CVD process, or an ALD process to have a thickness of about 50 to about 100 Å. For example, the barrier layer 225 may be formed by the sputtering process in which the temperature is about 150° C., the pressure is about 15 mTorr, the flow rate of the nitrogen gas is about 33 sccm, and the DC power is about 740 W.

Referring to FIGS. 4 and 5C, a metal layer 230, including a metal such as tungsten, is formed on the barrier layer 225, forming a contact structure 235 that makes contact with the polysilicon layer pattern 205. The contact structure 235 includes the resistance reducing layer 220, the barrier layer 225, and the metal layer 230.

According to the present invention, a resistance reducing layer includes a metal silicon nitride film that is changed from a metal silicide film using an ammonia or nitrogen plasma or by thermally treating in a nitrogen or ammonia atmosphere. Since the resistance reducing layer is formed between a polysilicon layer and a metal layer, an interface resistance between the polysilicon layer and the metal layer is reduced and a distribution of the interface resistance is very uniform. As a result, a conductive structure including the resistance reducing layer has a greatly reduced sheet resistance to improve electrical characteristics of the semiconductor device having the conductive structure.

Meanwhile, when a resistance reducing layer including a metal silicide film is formed on a polysilicon layer of which surface is treated using an ammonia or nitrogen plasma, an interface resistance between the polysilicon layer and a metal layer is greatly reduced.

Although the examples given herein illustrate the structure and sample processes of creating such a semiconductor structure, other processes and structures are possible while still staying within the scope of the present invention, for instance. Implementations having different processes and structures and other common variables in semiconductor devices are well within the scope of one skilled in the art, after being taught the principles of the invention disclosed above.

Those skilled in the art recognize that the different semiconductor devices described herein can be implemented in many different variations. Therefore, although various embodiments are specifically illustrated and described herein, it will be appreciated that modifications and variations of the present invention are covered by the above teachings and within the purview of the appending claims without departing from the spirit and intended scope of the invention.

What is claimed is:

1. A method of manufacturing a gate structure of a semiconductor device comprising:
    forming an insulation layer on a semiconductor substrate;
    forming a polysilicon layer on the insulation layer;
    treating a surface of the polysilicon layer using an ammonia plasma to reduce a sheet resistance of the gate structure;
    forming a resistance reducing layer on the polysilicon layer using a metal silicide formed by a physical vapor deposition process;
    forming a barrier layer on the resistance reducing layer; and
    forming a metal layer on the barrier layer, wherein the resistance reducing layer is structured to reduce a resistance between the polysilicon layer and the metal layer.

2. The method of claim 1, wherein forming the resistance reducing layer further comprises:
    forming a metal silicide film on the polysilicon layer; and
    changing the metal silicide film to a metal silicon nitride film.

3. The method of claim 2, wherein the metal silicide film is formed using an argon plasma.

4. The method of claim 2, wherein the metal silicon nitride film is formed by treating the metal silicide film using an ammonia plasma.

5. The method of claim 4, wherein the metal silicon nitride film is formed at a temperature of about 500 to about 1,000° C. with a power of about 50 to about 600 W for about 10 to about 30 seconds.

6. The method of claim 2, wherein the metal silicon nitride film is formed using a rapid thermal treatment process.

7. The method of claim 2, wherein the metal silicon nitride film is formed at a temperature of about 500 to about 1,000° C.

8. A method of forming a resistance reducing layer in a gate structure, the method comprising:
    forming a polysilicon layer on a substrate;
    treating a surface of the polysilicon layer using a plasma to reduce a sheet resistance of the gate structure;
    forming a metal silicide film on the polysilicon layer;
    changing the metal silicide film to a metal silicon nitride film, in which changing the metal silicide film to the metal silicon nitride film comprises treating the metal silicide film with an ammonia plasma and thermally treating the metal silicide film in an ammonia atmosphere; and
    forming a metal layer on the metal silicon nitride film.

9. A method of manufacturing a semiconductor device comprising:
    forming an insulation layer on a semiconductor substrate;
    forming a polysilicon layer on the insulation layer;
    forming a metal silicide layer on the polysilicon layer by a physical vapor deposition process;
    changing the metal suicide film to a metal silicon nitride film by an ammonia plasma process;
    forming a barrier layer on the metal silicon nitride film; and
    forming a metal layer on the barrier layer, wherein the metal suicide film is structured to reduce a resistance between the polysilicon layer and the metal layer.

10. The method of claim 9, wherein the metal silicide film is formed using an argon plasma.

* * * * *

UNITED STATES PATENT AND TRADEMARK OFFICE
CERTIFICATE OF CORRECTION

PATENT NO.       : 7,534,709 B2
APPLICATION NO. : 11/233580
DATED            : May 19, 2009
INVENTOR(S)      : Jae-Hwa Park et al.

It is certified that error appears in the above-identified patent and that said Letters Patent is hereby corrected as shown below:

Column 8, line 10, the word "and" should read -- and about --;
Column 12, line 33, claim 9, the word "suicide" should read -- silicide --;
Column 12, line 37, claim 9, the word "suicide" should read -- silicide --.

Signed and Sealed this

Twenty-ninth Day of September, 2009

David J. Kappos
*Director of the United States Patent and Trademark Office*